United States Patent
Stenson et al.

(10) Patent No.: US 8,263,469 B2
(45) Date of Patent: Sep. 11, 2012

(54) METHODS OF FORMING A BIPOLAR TRANSISTOR

(75) Inventors: Bernard Patrick Stenson, Limerick (IE); Andrew David Bain, Limerick (IE); Derek Frederick Bowers, Los Altos Hills, CA (US); Paul Malachy Daly, Limerick (IE); Anne Maria Deignan, Limerick (IE); Michael Thomas Dunbar, San Jose, CA (US); Patrick Martin McGuiness, Limerick (IE); William Allan Lane, Cork (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/267,780

(22) Filed: Oct. 6, 2011

(65) Prior Publication Data

US 2012/0028432 A1    Feb. 2, 2012

Related U.S. Application Data

(62) Division of application No. 12/611,068, filed on Nov. 2, 2009, now Pat. No. 8,058,704.

(51) Int. Cl.
*H01L 21/8228* (2006.01)

(52) U.S. Cl. ........ 438/322; 438/311; 438/342; 438/350; 257/593; 257/592; 257/566; 257/E29.184

(58) Field of Classification Search .................. 438/322, 438/311, 342, 350; 257/566, 574, 593, 592, 257/E29.184
See application file for complete search history.

(56) References Cited

U.S. PATENT DOCUMENTS

| | | | |
|---|---|---|---|
| 5,422,299 | A | 6/1995 | Neudeck et al. |
| 5,892,264 | A | 4/1999 | Davis et al. |
| 2004/0048428 | A1 | 3/2004 | Tanomura |
| 2004/0207046 | A1 | 10/2004 | Babcock et al. |
| 2006/0076645 | A1 | 4/2006 | Algotsson et al. |
| 2007/0001262 | A1 | 1/2007 | Ouyang et al. |
| 2009/0146258 | A1* | 6/2009 | Zhang et al. ................. 257/592 |

FOREIGN PATENT DOCUMENTS

| | | |
|---|---|---|
| EP | 1643549 | 4/2006 |
| WO | WO 9107779 | 5/1991 |

OTHER PUBLICATIONS

PCT International Search Report of May 10, 2011 for International Application No. PCT/US2010/054998, filed Nov. 1, 2010. 12 pages.
Written Opinion mailed Feb. 13, 2012 in International Application No. PCT/US2010/054998 filed on Nov. 1, 2010, in 7 pages.

* cited by examiner

*Primary Examiner* — Tu-Tu Ho
(74) *Attorney, Agent, or Firm* — Knobbe, Martens, Olson & Bear, LLP

(57) ABSTRACT

A bipolar transistor, comprising a collector, a base and an emitter, in which the collector comprises a relatively heavily doped region, and a relatively lightly doped region adjacent the base, and in which the relatively heavily doped region is substantially omitted from an intrinsic region of the transistor.

20 Claims, 4 Drawing Sheets

METHODS OF FORMING A BIPOLAR TRANSISTOR

CROSS REFERENCE TO RELATED CASE

This application is a divisional of U.S. application Ser. No. 12/611,068, filed Nov. 2, 2009, titled "Bipolar Transistor," the entire disclosure of which is hereby incorporated herein by reference.

FIELD OF THE INVENTION

The present invention relates to a bipolar transistor, and in particular to a bipolar transistor having an increased early effect voltage.

BACKGROUND OF THE INVENTION

For a bipolar transistor, it is desirable that the collector current $I_C$ is only a function of the base current $I_B$ with the ratio of these two being defined as the current gain of the transistor. However, as shown in FIG. 1, for a constant base current the collector current is not independent of the collector-emitter voltage in the region, generally designated 10, where the transistor is fully operational but instead the collector current varies with the voltage across the transistor. This region 10 can be extrapolated backwards to an intercept with the voltage across the transistor, and the intercept, generally designated $V_A$, is known as the "early voltage."

It is desirable for the slope of the region 10 to be as near horizontal as possible, which corresponds to a desire for the early voltage to be as large as possible, within the confines of other constraints on the fabrication of the transistor, such as the fabrication process used to form the transistors or at least the majority of the transistors within a semiconductor substrate.

SUMMARY OF THE INVENTION

According to a first aspect of the present invention, a bipolar transistor is provided comprising a collector, a base and an emitter, in which the collector comprises a relatively heavily doped region, and a relatively lightly doped region adjacent the base, and in which the relatively heavily doped region is substantially omitted from an intrinsic region of the transistor.

It is thus possible to provide a structure in which removal of the collector region from an intrinsic region of the device reduces the change in an effective base width as a function of collector voltage, and thereby lessens the consequences of one process that causes the transistor gain to vary as a function of collector voltage.

Such a transistor can be fabricated using the same processing steps (and not incurring any additional ones) as prior art transistors having a relatively highly doped collector in their intrinsic region. Such prior art transistors have higher current carrying capability but a reduced early voltage.

Advantageously, in accordance some embodiments, a transistor with an enhanced early voltage can be a vertically fabricated transistor and the relatively highly doped collector region can be fabricated substantially outside of a footprint of the base region.

According to a second aspect of the present invention, a method of forming a transistor having enhanced early voltage is provided. The method comprises providing a majority of a collector of the transistor in an extrinsic region of the transistor.

According to a third aspect of the present invention, a method of forming two transistor types on an integrated circuit is provided. A first type has a collector layer formed within an intrinsic region of the transistor of the first type, and the second type has at least a majority of a collector formed outside of an intrinsic region of the transistor of the second type. During a doping step to form the collector of the transistors of the first type, implantation into at least a majority of the intrinsic region of the transistors of the second type is inhibited by a mask.

BRIEF DESCRIPTION OF THE DRAWINGS

The present invention will further be described, by way of non-limiting examples only, with reference to the accompanying drawings, in which.

DETAILED DESCRIPTION OF PREFERRED EMBODIMENTS

The following detailed description is directed to certain specific embodiments of the invention. However, the invention can be embodied in a multitude of different ways. It should be apparent that the aspects herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Figure 1:
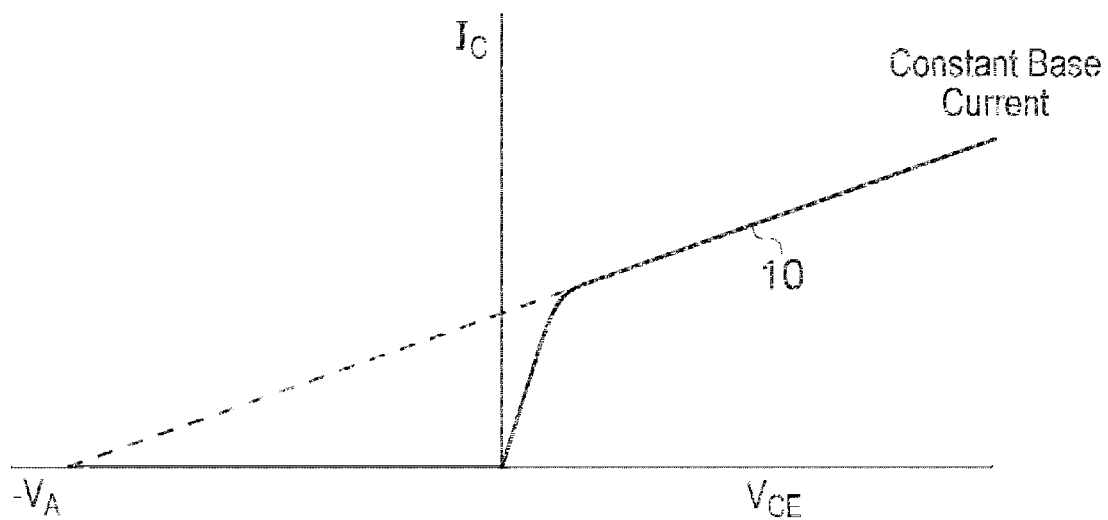
FIG. 1 schematically illustrates the variation in collector current as a function of collector to emitter voltage for a bipolar transistor operating with a constant base current.
Figure 2A:
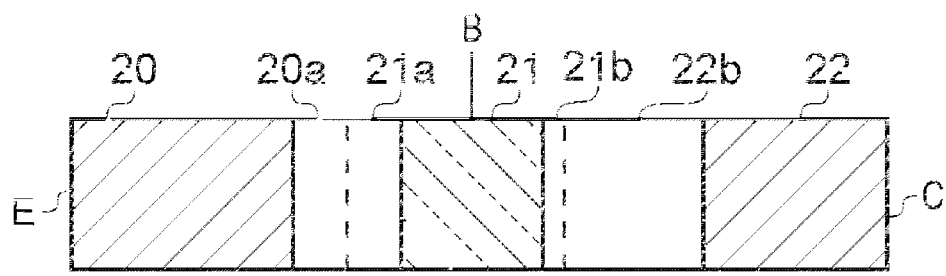
FIGS. 2a and 2b schematically illustrate a variation in base region width as a function of collector-base reverse bias as a result in changes in the size of depletion regions.
Figure 2B:
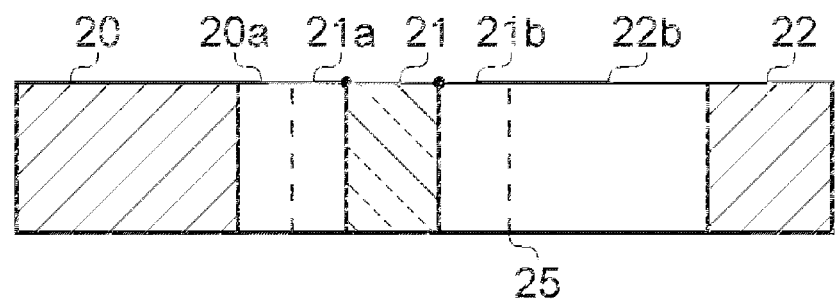

As noted hereinbefore, it is desirable for the gain of a bipolar transistor to be independent of the potential difference between its collector and emitter terminals. However, the gain may change due to the "early effect," named after its discoverer James Early. FIGS. 2a and 2b schematically illustrate the junctions within a bipolar transistor. FIG. 2a illustrates a transistor comprising an emitter region 20, a base region 21 and a collector region 22. Depletion regions extend between the emitter region 20 and the base region 21, with a first part of the depletion region, designated 20a, effectively belonging to the emitter and a second part of the depletion region, designated 21a, belonging to the base. The depletion region represents an area of the semiconductor where charges have been removed, as a result of the interplay between a desire for the charges to diffuse in order to remove diffusion gradients and the fact that the charges are charged, and such diffusion sets up an electrostatic field gradient. Similar depletion regions 21b and 22b exist between the base 21 and the collector 22. FIG. 2b shows the same transistor but now with a larger collector-to-emitter voltage. Because the transistor is switched on, the base-to-emitter voltage remains substantially invariant and hence the width of the depletion regions 20a and 21a also remains substantially invariant. Thus, as the voltage across the device increases, the potential difference occurs across the base-collector junction. This increased voltage causes the depletion regions 21b and 22b to extend, as is known to the person skilled in the art. The depletion regions extend either side of a nominal boundary, designated 25, between the base and collector regions. The distance by which the depletion region extends is a function of the dopant concentration. Thus, as will be discussed with regards to FIG. 3, the base region 21 tends to be more heavily doped than the collector region 22 (at least in the vicinity of the nominal base-collector junction 25) so the majority of the growth of the depletion region occurs on the collector side of the nominal boundary 25, i.e. within region 22b. However, and significantly, the depletion region 21b also changes in size and effectively reduces the width 21 of the base, as shown.

It is known by the person skilled in the art that in general, the gain of a transistor increases as the width of its base decreases. This is partially due to the fact that there is less chance for recombination of carriers within the narrower base region. It can thus be seen that increasing base-to-emitter voltage as described with respect to FIG. 2b causes the effective width of the base to vary with transistor voltage and hence gives to a change in gain as a function of collector voltage.

Figure 3:
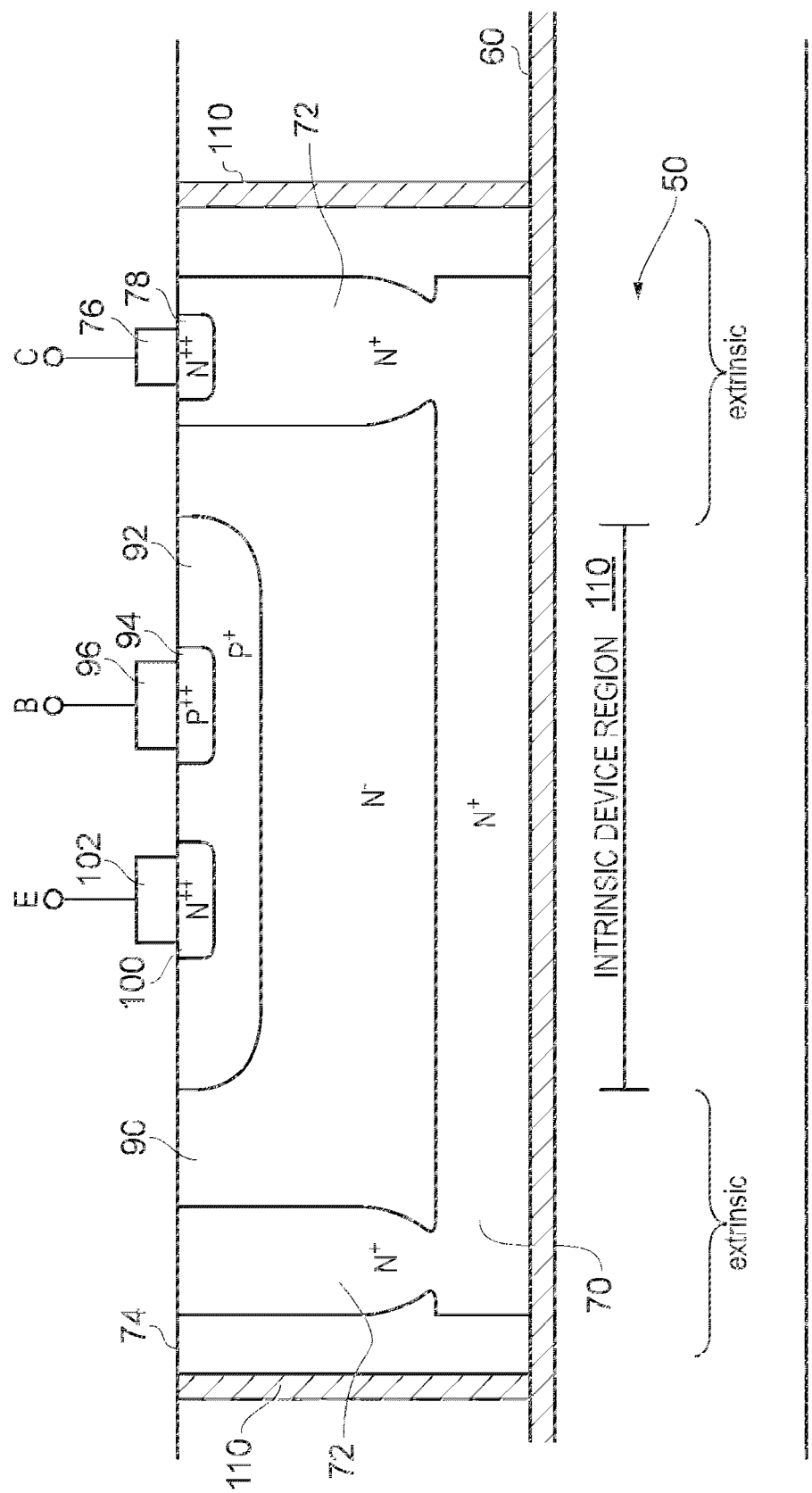
FIG. 3 schematically illustrates, in a cross section, doping in a vertically fabricated prior art bipolar transistor provided as part of an integrated circuit.

FIG. 3 schematically illustrates the structure of a bipolar transistor as might typically be provided within an integrated circuit.

It will be appreciated that there is a strong desire to keep the number of processing steps required to form an integrated circuit and all the transistors therein as low as possible, as each processing step incurs additional costs, increases fabrication time, and increases the chance of a transistor not being properly formed and hence reduces yield.

FIG. 3 schematically illustrates, in cross section, a doping profile for a vertically formed NPN bipolar transistor. The device typically comprises a handle wafer 50 which acts as substrate upon which the transistors are formed. The handle wafer 50 may, for example, be provided with an insulating layer 60, which may comprise silicon dioxide, in silicon on insulator (SOI) fabrication techniques. Insulating layer 60 need not be provided in all cases. The transistors of the integrated circuit are formed on the handle wafer 50 and/or insulating layer 60 by various processing steps including the deposition of an epitaxial layer, and masking and doping of the epitaxial layer at various stages in order to form the desired structures therein. The steps and processes required to do this are well known to the person skilled in the art, and are available as standard processes from semiconductor foundries. Therefore they do not need to be described in detail.

In the context of a vertically formed transistor, the transistor will be described as if it was orientated as shown in FIG. 3. Thus the handle wafer marks a "bottom" of the device and all the other layers are built above the handle wafer 50. Use of the terms up, down and so on should be construed accordingly with this in mind. Because the transistor is fabricated vertically, a bottom-most layer of the transistor acts as a collector region 70. The collector region 70 is, in this example, formed of $N^+$ doped semiconductor. As used herein N will designate a donor impurity, such as arsenic, P will designate an acceptor impurity, "−" designates lightly doped, "+" designates heavily doped and "++" designates very heavily doped. The relative concentrations represented by these symbols are known to the person skilled in the art.

Because the transistor is vertically formed, and the collector 70 is provided over an insulating layer 60, the collector region 70 is extended or provided with a conducting region up to the surface of the device in order that electrical contact can be made with it. Consequently vertically extending pillars or, as illustrated, walls 72 are formed by $N^+$ regions at the edge of the collector 70 and extend upwardly to a surface 74 of the transistor.

In three dimensions, the collector 70 and vertical walls 72 form a "cup" like shape within which the remainder of the transistor is formed. In order to make contact with a metallic collector electrode 76, an interface region 78 having very heavy N-type doping is provided. The interface region 78 provides low contact impedance.

A lightly doped $N^-$ region 90 is provided within the cup formed by the collector 70 and vertical walls 72. A $P^+$ base region 92, which forms the base of the transistor, is formed within the lightly doped $N^-$ region 90. An interface region 94, which is heavily doped with a P-type impurity, is provided so as to make a low impedance contact with a metallic base electrode 96.

An emitter region 100 of heavily doped N-type material ($N^{++}$) is formed with the P-type base region and is in contact with a metallic emitter electrode 102.

Millions of such transistors may be formed within a single integrated circuit. Therefore parasitic connections between the transistors should be avoided. This can be achieved either by forming the transistor within a further region of semiconductor above the substrate that is, in use, reversed biased so as to isolate the transistor from the substrate or, as shown in FIG. 3, by forming insulating walls 110 around the transistor such that the insulating walls 110, in conjunction with the insulating layer 60 effectively form an insulated well in which the transistor is formed.

The technologies for doing this are well known in the art.

As noted before, millions of transistors of this design, where the collector region lies beneath the base, may be formed in an integrated circuit. Thus this type of transistor can be regarded as the "majority" transistor or transistor of a first type within the integrated circuit and any process which requires additional steps other than that required to form this "majority" transistor represents an additional and avoidable cost. The "majority" transistor shown in FIG. 3 is suitable for carrying relatively large currents. However, such a device can be affected by the early effect.

The majority of the "active" part of this transistor occurs in the area of device known to the person skilled in the art as the intrinsic region 110. In broad terms the intrinsic region corresponds to the region or area of the transistor occupied by the base region 92 and the portion of the collector 70 horizontally aligned beneath the base region 92, when viewed from above. The remaining area of the device is known as the extrinsic region and, as shown in FIG. 3 comprises the vertically extending walls 72, which allows the relatively heavily doped collector layer 70 to be connected to the surface of the device and portion of the lightly doped region 90 which acts to separate the base region from the vertical walls 72. The portion of lightly doped region 90 between the base region 92 and the relatively heavily doped collector layer 70 is also often conventionally referred to as being part of the collector. This region 90 is relatively lightly doped. Thus the collector in the intrinsic part of the transistor can be regarded as having a relatively heavily doped region 70 and a relatively lightly doped region 90.

During use, when a base-collector voltage exists across the device a vertically extending depletion layer is formed in the intrinsic region and consequently the base width varies as a function of collector voltage.

The variation in transistor gain as a function of collector voltage could be reduced, i.e., the early voltage made greater, if the depletion region could be allowed to grow more freely within the lightly doped region 90, thereby lessening the amount by which the depletion region would grow into the base region 92. This could be achieved by further reducing the doping in the lightly doped region 90, but this would be deleterious to device performance as the resistance of the lightly doped region 90 would increase thereby making other features of the transistor undesirable. Furthermore, since the doping in the lightly doped region 90 is shared by all transistors across the wafer, then an attempt to change the early voltage for one or two transistors on an integrated circuit can have adverse consequences for all of the transistors on the integrated. Thus changing the doping concentrations may not be desirable.

Instead, where some transistors having an enhanced early voltage are called for, but not for the majority device within a semiconductor wafer, such modified transistors could be provided without incurring additional cost by modifying the formation of the majority device to exclude or remove the relatively heavily doped collector region within the intrinsic part of the device. Such an arrangement is shown in FIG. 4, where like reference numerals refer to parts similar to those of FIG. 3.

Figure 4:
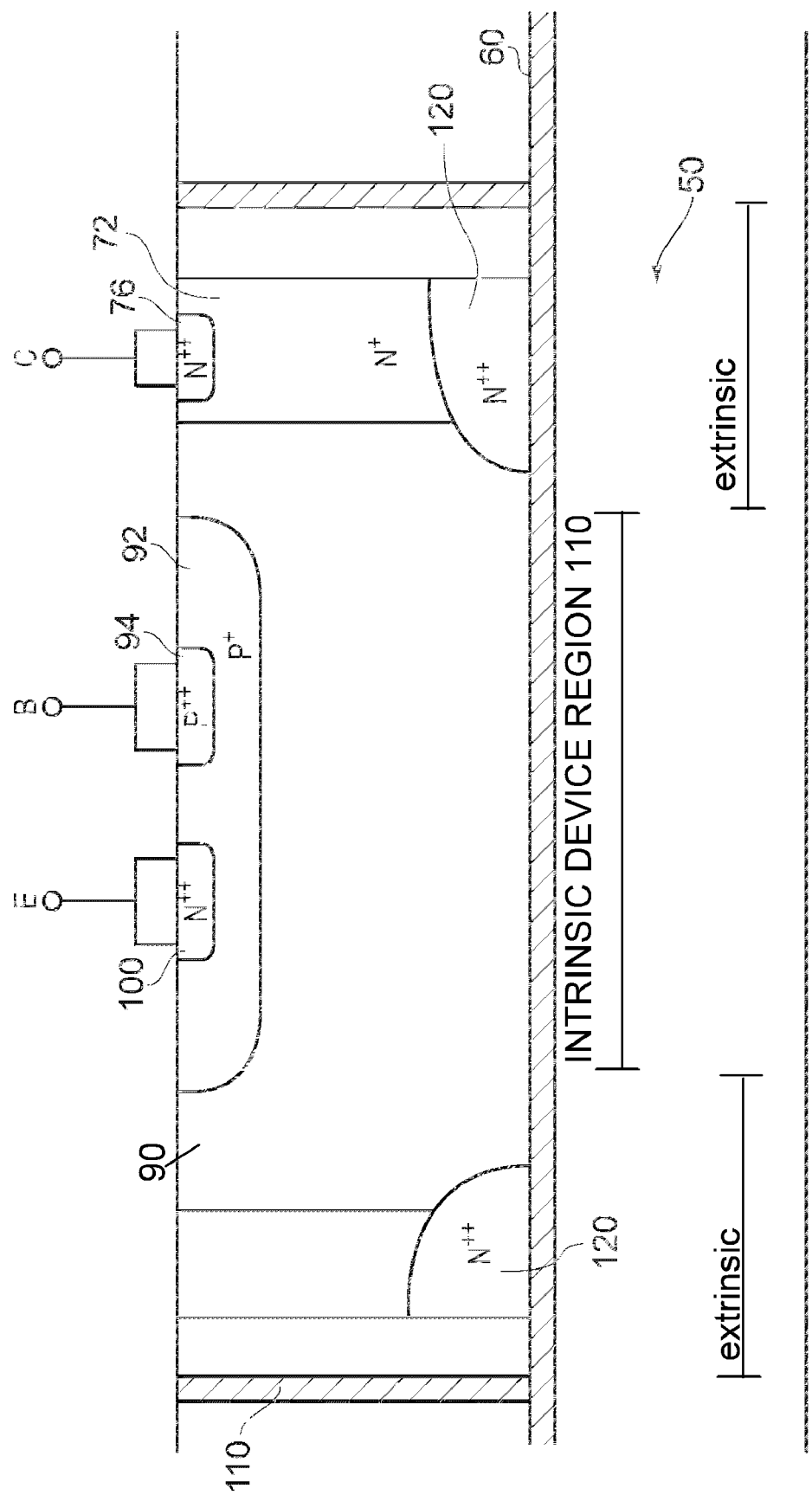
FIG. 4 schematically illustrates the doping in a transistor in accordance with an embodiment of the invention.

Thus comparing the device of FIG. 4 with that of FIG. 3 the $N^+$ collector heavily doped region 70 is no longer formed within the intrinsic region 110 of the device, and in fact can be regarded as having been removed altogether or substantially omitted from intrinsic region 110. As a result, the lightly doped epitaxial region 90 now extends all the way to the bottom of the device, which can be regarded as being defined by insulating layer 60 within the intrinsic region 110 of the device. A heavily doped collector region is formed as a buried collector region 120 of $N^+$ or $N^{++}$ doped semiconductor. As viewed from overhead, although it need not be a closed loop, in one embodiment the collector region 120 is a ring or annular shape. The collector region 120 in an overhead view can surround or encircle the entirety or at least the central portion of the base region 92. The buried collector region 120 is illustrated as being in a different plane or in a plane offset from the base region 92.

The relatively heavily doped collector region 120 is located on either side of the intrinsic region, and may even encroach into the intrinsic region 110 but does not extend as a fully formed heavily doped collector region across the entirety of the intrinsic region 110 in the device. One result of this is that at least the majority of the collector region 120 is in an extrinsic region of the transistor. Put another way, a collector region is not formed by doping in the full extent of the area underneath the base region 92, and therefore the collector region 120 does not fully overlap with the base region 92. In some embodiments, the collector region 120 may not include any overlap with the base region 92 and is therefore fully outside the intrinsic region 110. Thus, in the example illustrated in FIG. 4, the collector region 120 is formed outside the footprint of base region 92. Reducing the heavily doped collector region size reduces the current carrying capacity of the transistor, but it also allows the depletion region to grow more easily beneath the base region 92 of the transistor in response to an applied voltage and hence the variation in the width of the base region as a function of transistor voltage is significantly reduced.

A skilled artisan will appreciate that emitter region 100 of FIG. 4 is substantially similar to the emitter region 100 of FIG. 3.

It should be appreciated that transistors type as shown in FIG. 3 and the transistor in accordance with an embodiment of the present invention as shown in FIG. 4 can be formed within the same integrated circuit without increasing the number of masking and doping steps. This gives rise to significant fabrication benefits in terms of cost, complexity and yield.

Although the exemplary embodiment has been described in terms of NPN transistor, the skilled artisan will appreciate that the teachings herein can also be applied to PNP transistors.

As noted above, the majority of the transistors, which can be regarded as transistors of a first type, within an integrated circuit are formed with a collector extending through the intrinsic region of the completed device. This improves current carrying capacity within such majority transistors, or, put another way for a given current carrying capacity allows the transistor to be smaller than the transistors described herein as having an enhanced early voltage. Thus the processing steps used to fabricate the integrated circuit are chosen to be appropriate to forming the majority devices.

It should be remembered that both NPN and PNP variants of the majority devices may be employed in the same integrated circuit, and as a result a mask is likely to be applied to the wafer during a doping step to implant impurities into the collector layer 70, the mask serving to prevent doping into regions that form PNP transistors for example (and vice versa).

Figure 5:
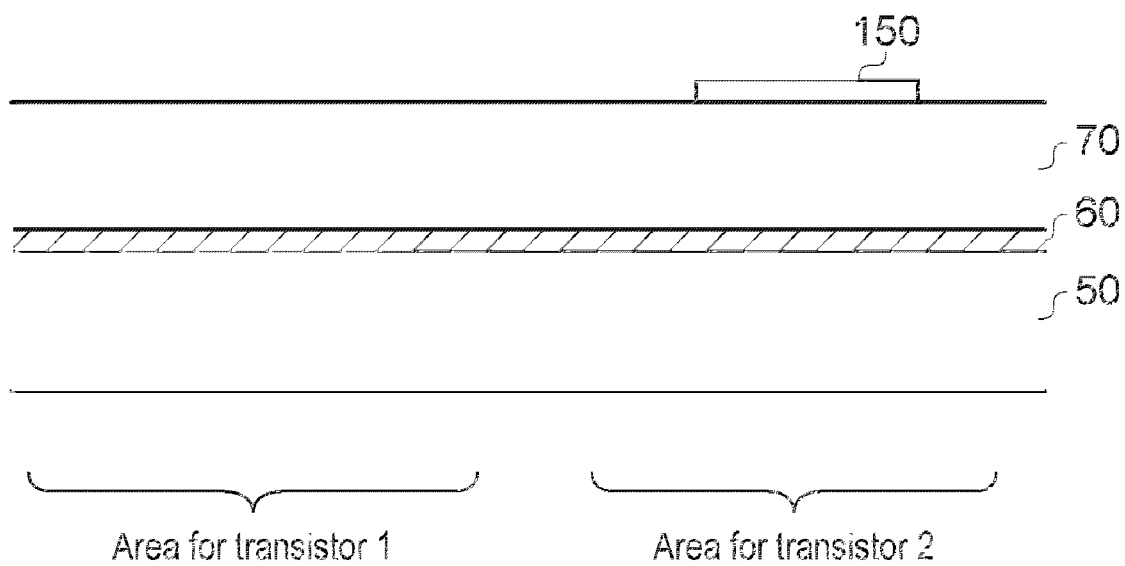
FIG. 5 schematically illustrates a mask position during doping to form a collector region.

In order to form an NPN transistor according to one embodiment, a mask 150, as illustrated in FIG. 5, can be placed over a region of the wafer that later on in the device fabrication process is vertically aligned with a base region (i.e., over the intrinsic region) of a transistor having an enhanced early voltage, which can be regarded as a transistor of a second type.

The illustrated portion of the mask 150 can be a mere modification of an existing mask and therefore not necessarily represent an additional mask. As will be appreciated by the skilled artisan, other portions (not shown) of the mask 150 can serve to block the collector implant from other regions of the integrated circuit, such as regions in which PNP transistors will be formed).

Once doping has occurred, a $N^+$ collector layer 70 is formed except in the area beneath the mask 150.

Thus, during a doping step to form the collector of transistors of the first type, implantation into transistors of the second type can be inhibited by the mask 150. In some embodiments, the mask 150 inhibits implantation in a majority or all of the intrinsic region of transistors of the second type during this doping step, but allows collector doping in the extrinsic region of the second type transistor(s), such that a majority or all of the collector of transistor(s) of the second type is formed substantially in the extrinsic region of transistors of the second type.

The mask 150 is then removed, and further processing of the transistor, for example, to build the lightly doped region 90 (see FIG. 4) by deposition is commenced.

It is thus possible to provide a second transistor type having enhanced early voltage alongside more conventional transistors without incurring a fabrication cost.

Applications

Transistors as described herein can be implemented in various electronic devices. Examples of the electronic devices can include high speed signal processing chips, power regulators, memory chips, memory modules, circuits of optical networks or other communication networks, and disk driver circuits. Products in which such electronics can be incorporated include, but are not limited to, consumer electronic products, parts of the consumer electronic products, electronic test equipments, etc. The consumer electronic products can include, but are not limited to, a mobile phone, cellular base stations, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A method of forming at least two transistor types on an integrated circuit, the method comprising:
    forming a relatively heavily doped collector region formed within an intrinsic region of a transistor of a first type;
    forming at least a majority of a relatively heavily doped collector region of a transistor of a second type outside of an intrinsic region of the transistor of the second type during doping to form the relatively heavily doped collector region of the transistor of the first type; and
    inhibiting, via a mask, implantation into at least a majority of the intrinsic region of the transistor of the second type while doping the relatively heavily doped collector region within the intrinsic region of the transistor of the first type.

2. The method of claim 1, wherein during doping to form the relatively heavily doped collector of the transistor of the first type, implantation is inhibited in a footprint of the transistor of the second type by the mask in at least the majority of the intrinsic region of the transistor of the second type.

3. The method of claim 1, wherein the integrated circuit comprises more transistors of the first type than transistors of the second type.

4. The method of claim 1, wherein during doping to form the relatively heavily doped collector region of the transistor of the first type, the mask additionally blocks implantation into other regions of the integrated circuit outside of transistors of the first type and transistors of the second type.

5. The method of claim 1, further comprising:
    forming a heavily doped collector region of the transistor of the second type, the heavily doped region being more doped than the relatively heavily doped region; and
    forming a relatively lightly doped collector region laterally adjacent the base region of the transistor of the second type.

6. The method of claim 1, wherein the relatively heavily doped collector region of the transistor of the second type is formed entirely outside the intrinsic region of the transistor of the second type.

7. A method of forming at least two transistor types on an integrated circuit, the method comprising:
    forming a relatively heavily doped collector region formed within an intrinsic region of a transistor of a first type;
    forming at least a majority of a relatively heavily doped collector region of a transistor of a second type outside of an intrinsic region of the transistor of the second type, wherein the transistor of the first type and the transistor of the second type are both NPN transistors; and
    inhibiting, via a mask, implantation into at least a majority of the intrinsic region of the transistor of the second type while doping the relatively heavily doped collector region within the intrinsic region of the transistor of the first type.

8. The method of claim 7, wherein during doping to form the relatively heavily doped collector region of the transistor of the first type, the relatively heavily doped collector region of the transistor of the second type is formed outside the intrinsic region of the transistor of the second type.

9. The method of claim 7, wherein the transistor of the second type has a reduced variation in a width of a base region as a function of a base-to-emitter voltage compared to the transistor of the first type.

10. The method of claim 7, further comprising:
    forming an insulating layer over a substrate;
    forming a base of the transistor of the second type defining the intrinsic region over the insulating layer; and
    forming a relatively lightly doped region surrounding sidewalls of the base of the transistor of the second type, the relatively lightly doped region extending downwardly to contact the insulating layer.

11. The method of claim 7, wherein the integrated circuit comprises more transistors of the first type than transistors of the second type.

12. The method of claim 7, wherein during doping to form the relatively heavily doped collector of the transistor of the first type, implantation is inhibited in a footprint of the transistor of the second type by the mask in at least the majority of the intrinsic region of the transistor of the second type.

13. A method of forming at least two transistor types on an integrated circuit, the method comprising:
    forming a relatively heavily doped collector region formed within an intrinsic region of a transistor of a first type;
    forming at least a majority of a relatively heavily doped collector region of a transistor of a second type outside of an intrinsic region of the transistor of the second type, wherein the transistor of the first type and the transistor of the second type are both PNP transistors; and
    inhibiting, via a mask, implantation into at least a majority of the intrinsic region of the transistor of the second type while doping the relatively heavily doped collector region within the intrinsic region of the transistor of the first type.

14. The method of claim 13, wherein during doping to form the relatively heavily doped collector of the transistor of the first type, implantation is inhibited in a footprint of the transistor of the second type by the mask in at least the majority of the intrinsic region of the transistor of the second type.

15. The method of claim 13, wherein forming at least the majority of the relatively heavily doped collector region of the transistor of the second type outside of the intrinsic region of the transistor of the second type is performed during doping to form the relatively heavily doped collector region of the transistor of the first type.

16. The method of claim 13, wherein the transistor of the second type has a reduced variation in a width of a base region as a function of a base-to-emitter voltage compared to the transistor of the first type.

17. The method of claim 13, further comprising:
forming an insulating layer over a substrate;
forming a base of the transistor of the second type defining the intrinsic region over the insulating layer; and
forming a relatively lightly doped region surrounding sidewalls of the base of the transistor of the second type, the relatively lightly doped region extending downwardly to contact the insulating layer.

18. A method of forming at least two transistor types on an integrated circuit, the method comprising:
forming a relatively heavily doped collector region formed within an intrinsic region of a transistor of a first type;
forming at least a majority of a relatively heavily doped collector region of a transistor of a second type outside of an intrinsic region of the transistor of the second type; and
inhibiting, via a mask, implantation into at least a majority of the intrinsic region of the transistor of the second type while doping the relatively heavily doped collector region within the intrinsic region of the transistor of the first type,
wherein the transistor of the second type has a reduced variation in a width of a base region as a function of a base-to-emitter voltage compared to the transistor of the first type.

19. A method of forming at least two transistor types on an integrated circuit, the method comprising:
forming an insulating layer over a substrate;
forming a relatively heavily doped collector region formed within an intrinsic region of a transistor of a first type;
forming at least a majority of a relatively heavily doped collector region of a transistor of a second type outside of an intrinsic region of the transistor of the second type; and
inhibiting, via a mask, implantation into at least a majority of the intrinsic region of the transistor of the second type while doping the relatively heavily doped collector region within the intrinsic region of the transistor of the first type;
forming a base of the transistor of the second type defining the intrinsic region over the insulating layer; and
forming a relatively lightly doped region surrounding sidewalls of the base of the transistor of the second type, the relatively lightly doped region extending downwardly to contact the insulating layer.

20. The method of claim 19, wherein the transistor of the second type has a reduced variation in a width of a base region as a function of a base-to-emitter voltage compared to the transistor of the first type.

* * * * *

UNITED STATES PATENT AND TRADEMARK OFFICE
CERTIFICATE OF CORRECTION

PATENT NO. : 8,263,469 B2  
APPLICATION NO. : 13/267780  
DATED : September 11, 2012  
INVENTOR(S) : Bernard Patrick Stenson et al.

It is certified that error appears in the above-identified patent and that said Letters Patent is hereby corrected as shown below:

On the Title Page

Please correct the spelling of the seventh inventor's last name from "McGuiness," to --McGuinness--.

In the Specifications

In column 1 at line 22, After "gain" insert --$\beta$--.

Signed and Sealed this  
Fourteenth Day of May, 2013

Teresa Stanek Rea  
*Acting Director of the United States Patent and Trademark Office*